United States Patent [19]
Yanagisawa

[11] Patent Number: 4,965,770
[45] Date of Patent: Oct. 23, 1990

[54] SEMICONDUCTOR MEMORY CAPABLE OF SIMULTANEOUSLY READING PLURAL ADJACENT MEMORY CELLS

[75] Inventor: Kasumasa Yanagisawa, Tokyo, Japan
[73] Assignee: Hitachi, Ltd., Tokyo, Japan
[21] Appl. No.: 101,380
[22] Filed: Sep. 25, 1987

[30] Foreign Application Priority Data
Sep. 26, 1986 [JP] Japan .................. 61-225992

[51] Int. Cl.$^5$ ........................................ G11C 11/418
[52] U.S. Cl. ........................ 365/238.5; 365/230.06; 365/230.03; 365/189.04; 340/799
[58] Field of Search ............... 365/63, 72, 189.04, 365/230.03, 230.06, 238.5, 230.05, 201, 218, 189.05; 340/799, 750

[56] References Cited

U.S. PATENT DOCUMENTS

| | | | |
|---|---|---|---|
| 4,561,072 | 12/1985 | Arakawa et al. | 365/230.03 |
| 4,587,637 | 5/1986 | Ishizuka | 365/230.03 |
| 4,597,063 | 6/1986 | Takemae | 365/189.05 |
| 4,729,119 | 3/1988 | Dennison et al. | 365/63 |
| 4,773,048 | 9/1988 | Kai | 365/230.03 |

FOREIGN PATENT DOCUMENTS

| | | | |
|---|---|---|---|
| 0024874 | 3/1981 | European Pat. Off. | 365/238.5 |
| 0058058 | 3/1986 | Japan | 365/230.03 |

Primary Examiner—Glenn Gossage
Attorney, Agent, or Firm—Fay, Sharpe, Beall, Fagan, Minnich & McKee

[57] ABSTRACT

A semiconductor memory has a function which enables data to be simultaneously read out from four memory cells, that is, a first memory cell disposed at the intersection between a first data line and a first word line which correspond to address signals, respectively, a second memory cell disposed at the intersection between the first data line and a second word line to which is assigned a row address adjacent to the row address corresponding to the first word line, a third memory cell disposed at the intersection between the first word line and a second data line to which is assigned a column address adjacent to the column address corresponding to the first data line, and a fourth memory cell disposed at the intersection between the second data line and the second word line.

6 Claims, 6 Drawing Sheets

SEMICONDUCTOR MEMORY CAPABLE OF SIMULTANEOUSLY READING PLURAL ADJACENT MEMORY CELLS

BACKGROUND OF THE INVENTION

The present invention relates to a semiconductor memory. More particularly, the present invention pertains to a technique which may effectively be utilized for, for example, a static type RAM (Random-Access Memory) which is employed as an arithmetic memory in an image processing system.

There is one type of image processing system which consists essentially of a CRT (Cathode-Ray Tube) display, a frame buffer memory and a bit map processor. This type of image processing system may incorporate an arithmetic memory for temporarily storing image data which is being prepared or changed. This arithmetic memory may be formed using, for example, static type RAMs such as those described in "Hitachi IC Memory Data Book", Hitachi, Ltd., Sept. 1983, pp. 243 to 247.

Conventional semiconductor memories, including these static type RAMs, are arranged such that one or more memory cells which are in a fixed positional relation to a given address signal are brought into a selected state, and data stored therein is then read.

In the image processing system of the type described above, a relatively important problem lies in zooming (reduction/enlargement) of the image being displayed. FIGS. 6a/6b and 7a/7b show one of the already-proposed arithmetic processing methods for effecting the above-described zooming process.

More specifically, in the case of FIG. 6a/6b a reduced image 6b reduced to, for example, 1/Z is to be obtained on the basis of image data concerning the displayed image 6a which has already been stored in the arithmetic memory. When an address (Xa·Ya) at which is disposed any picture element (va), in the reduced image 6b, is enlarged by substantially z times and projected on the original displayed image 6a, the pitch of the address (Xa'·Ya') is not always coincident with the pitch of the picture elements in the original displayed image 6a. For this reason, a value which is written as data concerning a picture element at the address (Xa·Ya) in the reduced image 6b is arithmetically obtained on the basis of data concerning four picture elements v0 to v3 which are closest to the above-described address (Xa'·Ya') in the original displayed image 6a. More specifically, first, pieces of data which respectively correspond to the picture elements v0 to v3 in the original displayed image 6a are read out from the arithmetic memory. Then, these pieces of read image data are respectively weighted in accordance with the distances from the address (Xa'·Ya') to the corresponding picture elements V0 to V3 and the weighted data values are averaged. Thus, it is possible to obtain a data value for any desired picture element va in the reduced image 6b.

On the other hand, when it is intended to prepare an enlarged image 7b enlarged, for example, Z times, on the basis of displayed image 7a as shown in FIG. 7a/7b, the address (Xb·Yb) of a picture element vb in the enlarged image 7b is reduced and projected on the original displayed image 7a to thereby obtain an address (Xb'·Yb') in the same way as in the case of FIG. 6a/6b. Then, pieces of data which respectively correspond to four picture elements v4 to v7 which are closest to the address (Xb'·Yb') are obtained. The pieces of read data are weighted in accordance with the corresponding distances and the weighted data values are then averaged. Thus, it is possible to obtain a data value for any picture element vb in the enlarged image of 7b.

The present inventor examined the above-described prior art and found that the prior art suffers from the following problems. Namely, static type RAMs and the like which are employed as arithmetic memories in image processing systems are means for reading data corresponding to one or more picture elements. That is, data stored in one or more memory cells, which are in fixed positional relation to a given picture element address. The prior art systems do not simultaneously read data stored in the memory cells which are closest to a designated address. Accordingly, it is necessary, in the case of effecting the above-described zooming of a displayed image, to execute the read operation of the arithmetic memory four times for each of the addresses of the picture elements in a reduced or enlarged image. This causes the time required for a zooming process to increase unnecessarily. It also increases the time during which the bit map processor is occupied, which results in lowering the processing capabilities of the system.

BRIEF SUMMARY OF THE INVENTION

A semiconductor memory such as a static type RAM is provided with a function which enables four memory cells to be simultaneously brought into a select state, that is, one memory cell disposed at the intersection between a data line and a word line specified by address signals and three memory cells respectively disposed at the intersections between the data and word lines and a data line and a word line which are adjacent to said data and word lines and to which subsequent addresses are assigned, respectively, and which function further permits pieces of data stored in these four memory cells to be read simultaneously in one memory access cycle.

By virtue of the above-described means, the present invention offers the following advantages. In a zooming process, or the like in an image processing system, it is possible to simultaneously read in one memory access cycle pieces of data stored in four nearby memory cells, i.e., bits, which are required to determine an image data value corresponding to each of the addresses in a reduced or enlarged image. Accordingly, it is possible to increase the speed of the zooming process executed in the image processing system and reduce the load on the bit map processor in the zooming process to thereby improve the processing capabilities of the system.

It is the object of the present invention to provide a semiconductor memory having a novel function which is suitable for a zooming process or the like.

It is another object of the present invention to improve the processing capability of an image processing system.

The above and other objects and novel features of the present invention will become more apparent from the following description of the preferred embodiment thereof, taken in conjunction with the accompanying drawings.

DESCRIPTION OF THE PREFERRED EMBODIMENT

Figure 1:
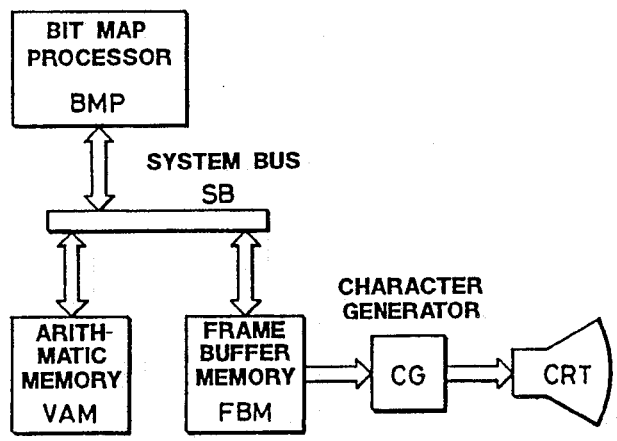
FIG. 1 is a block diagram showing one example of an image processing system including an arithmetic memory constituted by static type RAMs to which the present invention is applied.

FIG. 1 is a block diagram showing one example of an image processing system including an arithmetic memory VAM constituted by static type RAMs to which the present invention is applied.

Referring to FIG. 1, the image processing system includes a bit map processor BMP, an arithmetic memory VAM and a frame buffer memory FBM, although not necessarily limited thereto.

The bit map processor BMP is a microprogram system processor which controls the whole of the image processing system, although not necessarily limited thereto. The bit map processor BMP is coupled to the arithmetic memory VAM and the frame buffer memory FBM through a system bus SB. The system bus SB includes a 32-bit data bus, an address bus for a plurality of bits, and a control bus, although not necessarily limited thereto.

The arithmetic memory VAM includes eight static type RAMs and a memory control unit MCU which controls these RAMs as described below. Each static type RAM is coupled to a memory control unit MCU through an internal bus provided within the arithmetic memory VAM. The arithmetic memory VAM temporarily stores basic data required to execute image processing and also stores image data concerning a displayed image which is being prepared or changed. A practical arrangement and operation of the arithmetic memory VAM will be described later in detail.

The frame buffer memory FBM is constituted by a plurality of dual-port memories, although not necessarily limited thereto. Each of the dual-port memories has a random-access port and a serial-access port. The frame buffer memory FBM temporarily stores image data for one frame of an image which is to be displayed on a CRT display. Pieces of image data are supplied from the bit map processor BMP to the random-access ports of the dual-port memories constituting the frame buffer memory FBM through the system bus SB. The pieces of image data stored in the frame buffer memory FBM are serially read out through the serial-access ports of the dual-port memories.

The image data output from the frame buffer memory FBM is supplied to the CRT through a character generator CG.

In the image processing system in accordance with this embodiment, the image data stored in the arithmetic memory VAM consists of eight bits, although not necessarily limited thereto. The image data is usually stored in such a manner that the eight bits are distributed to the eight static type RAMs, respectively. In other words, each of the addresses in each static type RAM corresponds to each of the picture elements in the displayed image. The bit map processor BMP of the image processing system in accordance with this embodiment has a zooming process function which enables a displayed image to be reduced or enlarged in any desired ratio. In the zooming process, each of the static type RAMs constituting the arithmetic memory VAM is set in the zooming read mode in which pieces of storage data are simultaneously read from a total of four memory cells, that is, one memory cell specified by an address signal and three memory cells which are in a preselected memory relationship to the one memory cell. This relation preferably comprises disposing the three memory cells at the intersections or junctions between the data and word lines to which the first memory cell is coupled and a data line and a word line which are adjacent to these data and word lines and to which are assigned subsequent addresses, respectively. At this time, the image data which is output from the arithmetic memory VAM to the bit map processor BMP consists of a total of 32 bits for four picture elements. More specifically, the bit map processor BMP reads out in one memory access cycle pieces of data corresponding to four nearby picture elements which are required to execute a zooming process. Thus, the zooming process in the image processing system is executed efficiently, and the processing capability of the system is improved.

Figure 2:
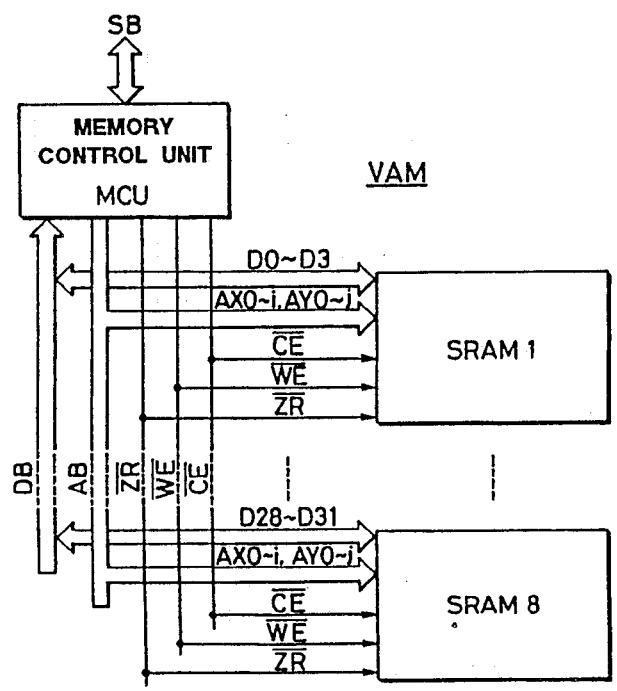
FIG. 2 is a block diagram showing one example of the arithmetic memory shown in FIG. 1.

FIG. 2 is a block diagram showing one example of the arithmetic memory VAM in the image processing system shown in FIG. 1.

Referring to FIG. 2, the arithmetic memory VAM includes eight static type RAMs (SRAM1 to SRAM8) and a memory control unit MCU which controls these static type RAMs, although not necessarily limited thereto. The memory control unit MCU in the arithmetic memory VAM is coupled to the bit map processor BMP through the above-described system bus SB. Each static type RAM is coupled to the memory control unit MCU through an internal bus within the arithmetic memory VAM.

The data bus DB consists of data input/output signal lines for 32 bits, although not necessarily limited thereto. These data input/output signal lines are divided into eight groups each consisting of four signal lines which are coupled to the corresponding static type RAM as shown in FIG. 2. More specifically, among the 32 data input/output signal lines constituting the data bus DB, the data input/output signal lines D0 to D3 for first to fourth bits are coupled to the first static type RAM (SRAM 1). Similarly, the second to seventh signal line groups, i.e., the fifth to eighth data input/output signal lines D4 to D7 to the twenty-fifth to twenty-eighth data input/output signal lines D24 to D27, are respectively coupled to the second to seventh static type RAMs (SRAM 2 to SRAM 7). The data input/output signal lines D28 to D31 for the twenty-ninth to thirty-second bits are coupled to the eighth static type RAM (SRAM 8).

The address bus AB includes signal lines for supplying X-address signals AX0 to AXi for i+1 bits used to specify a row address in each static type RAM and signal lines for supplying Y-address signals AY0 to AYj for j+1 bits used to specify a column address in each static type RAM. These signal lines constituting the address bus AB are mutually coupled to the eight static type RAMs.

The control bus includes a chip enable signal line $\overline{CE}$, a write enable signal line $\overline{WE}$, and a zooming read signal line $\overline{ZR}$. These signal lines are normally placed at a high level and are selectively shifted to a low level and thereby validated. More specifically, when the arithmetic memory VAM is brought into a non-select state, the chip enable signal $\overline{CE}$ is raised to the high level, whereas, when the arithmetic memory VAM is brought into a select state, the chip enable signal $\overline{CE}$ is changed to the low level. The write enable signal $\overline{WE}$ is raised to the high level when the arithmetic memory VAM is brought into a non-select state or when it is brought into a select state in the read operation mode, and the write enable signal $\overline{WE}$ is shifted to the low level when the arithmetic memory VAM is brought into a select state in the write operation mode. The zooming read signal $\overline{ZR}$ (read control signal) is raised to the high level when the arithmetic memory VAM is brought into a non-select state or when it is brought into a select state in the normal operation mode, and the zooming read signal $\overline{ZR}$ is selectively shifted to the low level when the arithmetic memory VAM is brought into a select state in the zooming read mode.

The memory control unit MCU controls the operation of inputting and outputting image data which is exchanged between the bit map processor BMP and each static type RAM. The memory control unit MCU includes a buffer (not shown) for temporarily storing address signals and image data and a timing generator circuit (not shown) for forming the above-described chip enable signal $\overline{CE}$, write enable $\overline{WE}$ and zooming read signal $\overline{ZR}$ in accordance with various control signals supplied from the bit map processor BMP.

The static type RAMs (SRAM1 to SRAM8) are selectively activated in response to the chip enable signal $\overline{CE}$. If, at this time, the write enable signal $\overline{WE}$ is at the high level, the static type RAMs are set in the read operation mode, whereas, if the write enable signal WE is at the low level, the RAMs are set in the write operation mode. If, in the read operation mode, the zooming read signal $\overline{ZR}$ is at the high level, the static type RAMs are set in the normal read operation mode, whereas, if the zooming read signal ZR is at the low level, the RAMs are set in the zooming read mode.

When the static type RAMs are set in the normal read operation mode, 1-bit of read data is output from each static type RAM through the corresponding one of the top data input/output signal lines, D0, D4 . . . D28, although not necessarily limited thereto. When the static type RAMs are set in the zooming read mode, four-bit read data is output from each static type RAM through the corresponding signal line groups each consisting of four data input/output signal lines D0 to D3 . . . D28 to D31.

Figure 3:
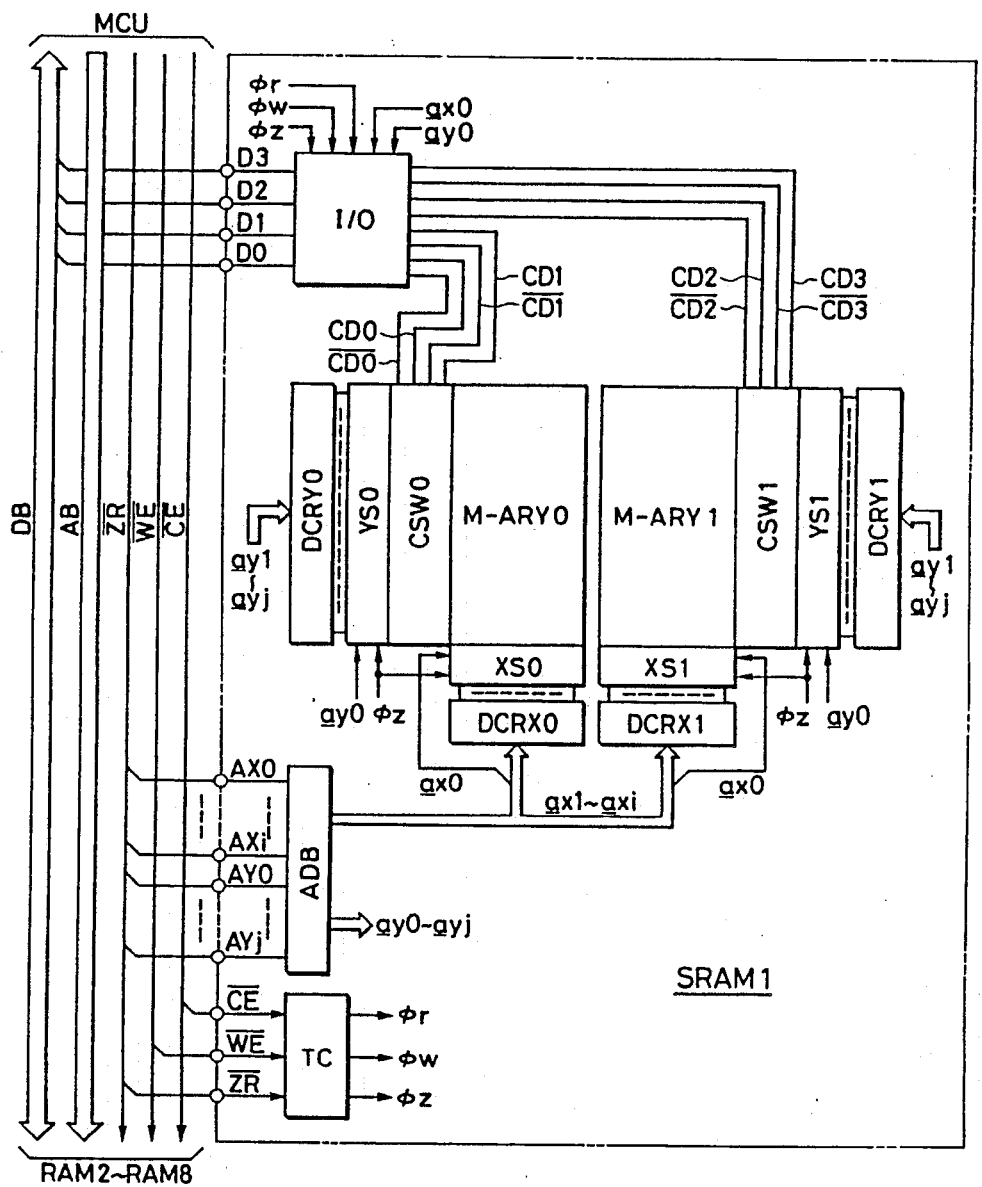
FIG. 3 is a block diagram showing one example of one static type RAM shown in FIG. 2.

FIG. 3 is a block diagram showing one example of one of the static type RAMs shown in FIG. 2. The first static type RAM (SRAM1) is shown in this FIGURE; the remaining second to eighth static type RAMs (SRAM2 to SRAM8) have a similar arrangement. Circuit elements constituting each circuit block in FIG. 3 are fabricated on a single semiconductor substrate such as single crystal silicon (although not necessarily limited thereto) using a known semiconductor integrated circuit manufacturing technique.

Referring to FIG. 3, the static type RAM in accordance with this embodiment is basically composed of a memory arrayed M-ARY0 provided in correspondence with word lines which are assigned even-number row addresses and a memory array M-ARY1 provided in correspondence with word lines to which are assigned odd-numbered row addresses.

The memory array M-ARY0 consists of $n+1$ pairs of complementary data lines D0·$\overline{D0}$ to Dn·$\overline{Dn}$ which are arranged so as to extend horizontally as viewed in the FIG. 4A $(m+1)/2$ even-number row address word lines W0 to Wm-1 which are disposed vertically, and $(n+1)\times(m+1)/2$ static type memory cells which are respectively disposed at the intersections between the complementary data lines and the word lines, as described later. Similarly, the memory array M-ARY1 consists of $n+1$ pairs of complementary data lines D0·$\overline{D0}$ to Dn·$\overline{Dn}$ which are arranged so as to extend horizontally as viewed in the FIG. 4B, $(m+1)/2$ odd-number row address word lines W1 to Wm which are disposed vertically, and $(n+1)\times(m+1)/2$ static type memory cells which are respectively disposed at the intersections between the complementary data lines and the word lines.

With further reference to FIG. 3, the word lines constituting the memory array M-ARY0 are coupled to an X-address decoder DCRX0 through an X-switching circuit XS0 and are selectively brought into a select state which is defined by a high level. Similarly, the word lines constituting the memory array M-ARY1 are coupled to an X-address decoder DCRX1 through an X-switching circuit XS1 and are selectively brought into a select state which is defined by a high level.

The X-address decoders DCRX0 and DCRX1 are supplied with complementary internal address signals ax1 to axi (herein, for example, when both the non-inverted internal address signal ax0 and the inverted internal address signal $\overline{ax0}$ are input to a circuit, it will be represented by an internal address signal $\widetilde{ax0}$; the same is the case with those mentioned hereinafter) except for the address signal for the least significant bit from an address buffer ADB described later. The X-switching circuits XS0 and XS1 are supplied with the complementary internal address signal $\widetilde{ax0}$ for the least significant bit from the address buffer $\overline{ADB}$ and are also supplied with a timing signal $\phi z$ from a timing control circuit TC described later. The complementary internal address signals ax0 to axi are formed on the basis of X-address signals AX0 to AXi which are supplied through the address bus AB. The timing signal is shifted to a low level when the static type RAM is brought into a non-select state or when it is brought into a select state in the normal operation mode, and the timing signal $\phi z$ is raised to a high level when the static type RAM is brought into a select state in the zooming read mode.

Each of the X-address decoders DCRX0 and DCRX1 decodes the complementary internal address signals ax1 to axi supplied from the address buffer ADB to form a word line select signal. In the X-address decoders DCRX0 and DCRX1, the corresponding word line select signals are simultaneously raised to a high level. These word line select signals are supplied to the corresponding X-switching circuits XS0 and XS1, respectively. Each of the X-switching circuits XS0 and XS1 brings one word line in the corresponding memory array M-ARY0 (or M-ARY1) into a select state which is defined by a high level in accordance with the word line select signal supplied from the corresponding address decoder DCRX0 (or DCRX1), the complementary internal address signal ax0 for the least significant bit, and the timing signal $\phi z$.

More specifically, when the static type RAM is brought into a select state in the normal operation mode and the timing signal $\phi z$ is shifted to the low level, the X-switching circuits XS0 and XS1 select one word line specified by the word line select signal from either the memory array M-ARY0 or M-ARY1 in accordance with the complementary internal address signal ax0. When the static type RAM is set in the zooming read mode and the timing signal $\phi z$ is raised to the high level, the X-switching circuits XS0 and XS1 simultaneously select word lines, respectively, specified by the word line select signal from both the memory arrays M-ARY0 and M-ARY1. If, at this time, the complementary internal address signal ax0 represents the logic "1", the X-switching circuit $\overline{\text{XS0}}$ selects a subsequent word line which is adjacent to the word line specified by the word line select signal. More specifically, when the static type RAM is set in the zooming operation mode, a word line which is specified by the X-address signals AX0 to AXi and a word line which is adjacent to this word line and to which a subsequent row address is assigned are simultaneously brought into a select state.

Among the complementary data lines constituting the memory array M-ARY0, the even-number column address complementary data lines D0·$\overline{\text{D0}}$, D2·$\overline{\text{D2}}$ to Dn−1·$\overline{\text{Dn}-1}$ are coupled to complementary common data lines CD0·$\overline{\text{CD0}}$ through corresponding switching MOSFETs in a column switch CSW0. The odd-number column address complementary data lines D1·$\overline{\text{D1}}$, D3·$\overline{\text{D3}}$ to Dn·$\overline{\text{Dn}}$ are coupled to complementary data lines CD1·$\overline{\text{CD1}}$ through corresponding switching MOSFETs in the column switch CSW0. Similarly, among the complementary data lines constituting the memory array M-ARY1, even-number column address complementary data lines D0·$\overline{\text{D0}}$, D2·$\overline{\text{D2}}$ to Dn−1·$\overline{\text{Dn}-1}$ are coupled to complementary common data lines CD2·$\overline{\text{CD2}}$ through corresponding switching MOSFETs in a column switch CSW1, and odd-number column address complementary data lines CD3·$\overline{\text{CD3}}$ through corresponding switching MOSFETs in the column switch CSW1. The respective gates of each pair of switching MOSFETs in each of the column switches CSW0 and CSW1 are mutually connected and supplied with the data line select signal from the corresponding Y-address decoder DCRY0 or DCRY1 through a Y-switching circuit YS0 or YS1.

The Y-address decoders DCRY0 and DCRY1 are supplied with the complementary internal address signals ay1 to ayj except for the address signal for the least significant bit from the address buffer ADB. The Y-switching circuits YS0 and YS1 are supplied with the complementary internal address signal ay0 for the least significant bit from the address buffer ADB and also supplied with the above-described timing signal $\phi z$ from the timing control circuit TC. The complementary internal address signals ay0 to ayj are formed on the basis of the Y-address signals AY0 to AYj supplied through address bus AB.

Each of the Y-address decoders DCRY0 and DCRY1 decodes the complementary internal address signals ay1 to ayj supplied from the address buffer ADB to form a data line select signal. The corresponding data line select signals in the Y-address decoders DCRY0 and DCRY1 are simultaneously raised to a high level. These data line select signals are respectively supplied to the corresponding Y-switching circuits YS0 and YS1. Each of the Y-switching circuits YS0 and YS1 selects one or two pairs of complementary data lines in the corresponding memory array M-ARY0 (or M-ARY1) in accordance with the above-described data line select signal supplied from the Y-address decoder DCRY0 (or DCRY1), the complementary internal address signal ay0 for the least significant bit and the timing signal $\phi z$.

More specifically, when the static type RAM is brought into a select state in the normal operation mode and the timing signal $\phi z$ is shifted to the low level, each of the Y-switching circuits YS0 and YS1 selects one pair of complementary data lines specified by the least significant bit complementary internal address signal ay0 and the data line select signal from the corresponding memory array M-ARY0 (or M-ARY1), and each Y-switching circuit connects the selected complementary data lines to the corresponding complementary common data lines CD0·$\overline{\text{CD0}}$ or CD1·$\overline{\text{CD1}}$ (or CD2·$\overline{\text{CD2}}$ or CD3·$\overline{\text{CD3}}$). A total of two pairs of complementary data lines thus selected are further subjected to selection in an input/output circuit I/O (described later), and data read out from one memory cell which is specified by the X-address signals AX0 to AXi and the Y-address signals AY0 to AYj is eventually delivered from a data input/output terminal DO. When the static type RAM is set in the zooming read mode and the timing signal $\phi z$ is raised to a high level, each of the Y-switching circuits YS0 and YS1 simultaneously selects from the corresponding memory array M-ARY0 (or M-ARY1) a pair of complementary data lines specified by the least significant bit complementary internal address signal ay0 and the data line select signal and a subsequent pair of complementary data lines which are adjacent to said pair of complementary data lines, and each Y-switching circuit connects the selected pairs of complementary data lines to the corresponding complementary data lines CD0·$\overline{\text{CD0}}$ and CD1·$\overline{\text{CD1}}$ (or CD2·$\overline{\text{CD2}}$ and CD3·$\overline{\text{CD3}}$). Pieces of data read out from four memory cells which are output through these complementary common data lines are rearranged in the input/output circuit I/O and are delivered from data input/output terminals D0 to D3 in a predetermined combination.

A practical circuit configuration and operation of each of the memory arrays, column switches and switching circuits will be described later in more detail.

The address buffer ADB latches and holds the X-address signals AX0 to AXi and Y-address signals AY0 to AYj which are supplied from the memory control unit MCU through the address bus AB. The address buffer ADB further forms complementary internal address signals ax0 to axi and ayj on the basis of the latched address signals and supplies the complementary internal address signals to the X-address decoders DCRX0, DCRX1 and the Y-address decoders DCRY0 and DCRY1.

The input/output circuit I/O includes data input buffers DIB0 to DIB3, data output buffers DOB0 to DOB3 which are provided in correspondence with the data input/output buffers and the complementary common data lines CD0·$\overline{\text{CD0}}$ to CD3·$\overline{\text{CD3}}$ in a predetermined combination, as described below. The input/output select circuits SEL of the input/output circuit I/O is supplied with the least significant bit complementary internal address signal ax0 and ay0 from the address buffer ADB and is further supplied with the timing signal $\phi z$ from the timing control circuit TC. The data input buffers DIB0 to DIB3 of the input/output circuit I/O are mutually supplied with a timing signal $\phi w$ from the timing control circuit TC. The data output buffers DOB0 to DOB3 of the input/output circuit I/O are mutually supplied with a timing signal or from the timing circuit TC. The timing signal $\phi w$ is raised to a high level when the static type RAM is in a select state in the write operation mode and the memory cell select operation is completed. The timing signal $\phi w$ is also raised to the high level when the static type RAM is in a select state in the read operation mode and read signals output from selected memory cells are established on the corresponding complementary common data lines.

The input/output select circuit SEL of the input/output circuit I/O connects the complementary common data lines $CD0 \cdot \overline{CD0}$ to $CD3 \cdot \overline{CD3}$ to the data input buffers DIB0 to DIB3 and the data output buffers DOB0 and DOB3 in a predetermined combination in accordance with the timing signal $\phi z$ and the least significant bit complementary internal address signals ax0 and ay0. More specifically, when the static type RAM is set in either the write operation mode or the normal read operation mode, the input/output select circuit SEL connects one pair of complementary common data lines $CD0 \cdot \overline{CD0}$ to $CD3 \cdot \overline{CD3}$ to which is connected one selected memory cell to both the data input buffer DIB0 and the data output buffer DOB0. When the static type RAM is set in the zooming read mode, the input/output select circuit SEL connects the complementary common data lines $CD0 \cdot \overline{CD0}$ to $CD3 \cdot \overline{CD3}$ to which are connected four selected memory cells to the data input buffers DIB0 to DIB3 and the data output buffers DOB0 to DOB3 in a predetermined combination.

The data input buffers DIB0 to DIB3 of the input/output circuits I/O are selectively activated when the timing signal $\phi w$ is raised to the high level. In this activated state, the data input buffers DIB0 to DIB3 form complementary write signals from write data which is supplied from the memory control unit MCU through the data bus DB and the data input/output terminals D0 to D3. These complementary write signals are delivered to the complementary common data lines $CD0 \cdot \overline{CD0}$ to $CD3 \cdot \overline{CD3}$ through the above-described input/output select circuit SEL.

The data output buffers DOB0 to DOB3 of the input/output circuit I/O are selectively activated when the timing signal $\phi r$ is raised to the high level. In this activated state, the data output buffers DOB0 to DOB3 amplify read signals which are output from selected memory cells through the complementary data lines $CD0 \cdot \overline{CD0}$ to $CD3 \cdot \overline{CD3}$. These pieces of read data are delivered through the corresponding data input/output terminals D0 to D3.

A practical arrangement and operation of the input/output circuit I/O will be described later in detail.

The timing control circuit TC receives the chip enable signal $\overline{CE}$, write enable signal $\overline{WE}$, and the zooming read signal $\overline{ZR}$ which are externally supplied as control signals, forms the above-described various timing signals in accordance with these control signals, and supplies the timing signals to the respective circuits.

Figure 4A:
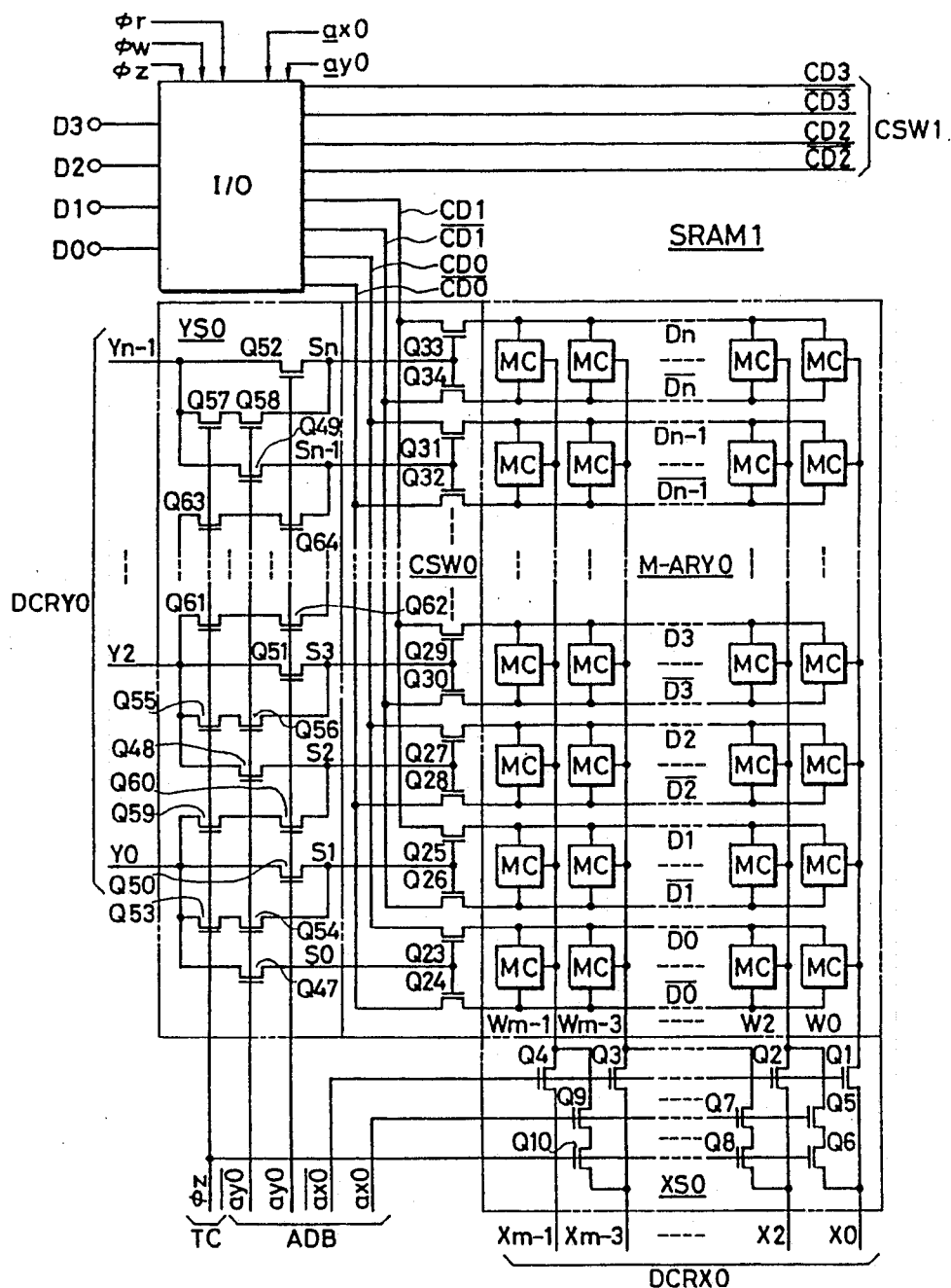
FIGS. 4A and 4B are circuit diagrams showing examples of memory arrays and peripheral circuits in the static type RAM shown in FIG. 3.
Figure 4B:
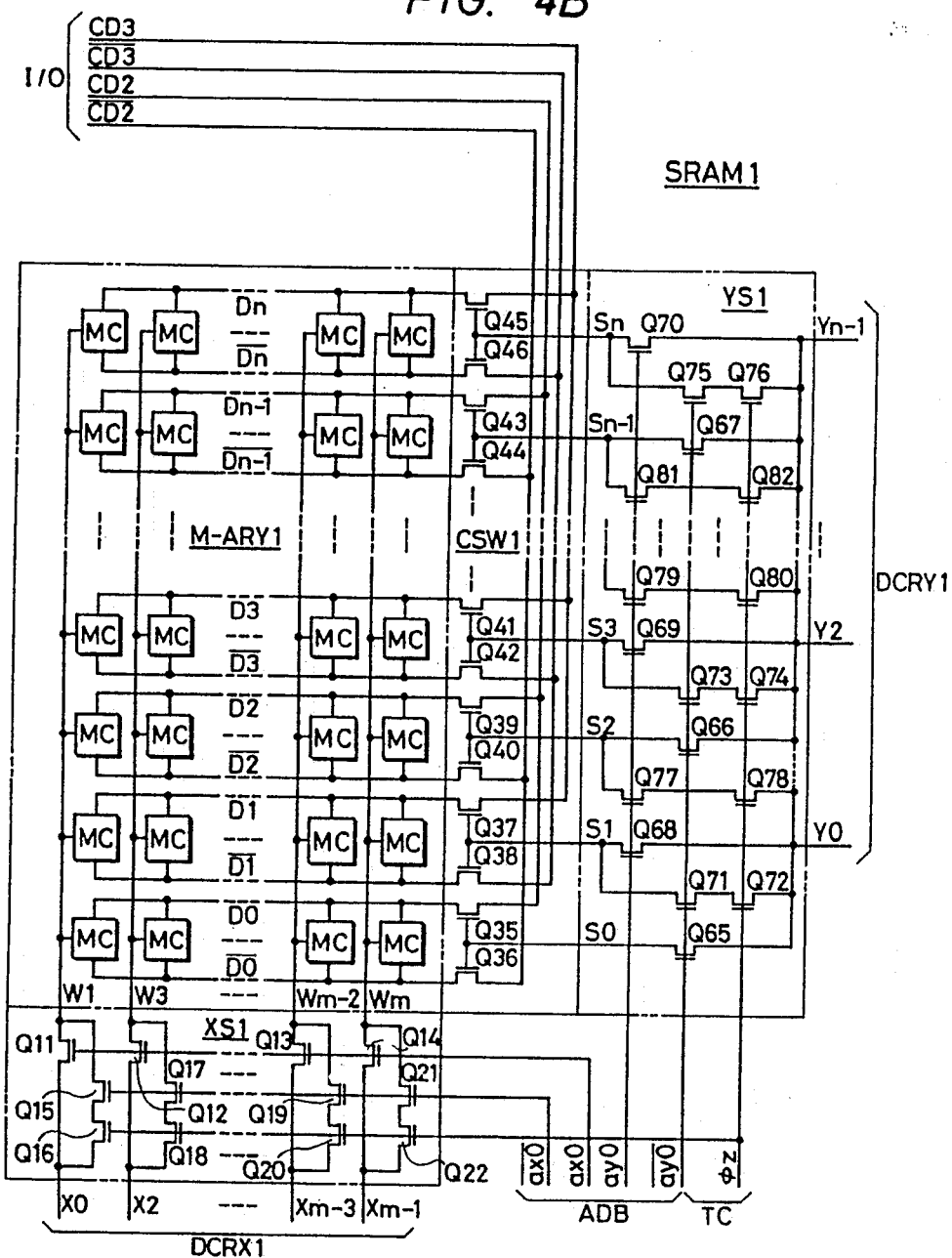

FIGS. 4A and 4B are circuit diagrams respectively showing examples of the memory arrays M-ARY0 and M-ARY1 and their peripheral circuits shown in FIG. 3. All the MOSFETs shown in these FIGURES are of the N-channel type. All the memory cells MC are of the static type and each memory cell is constituted by two CMOS inverters whose input/output nodes are cross-coupled to each other.

As described above, the static type RAM in this embodiment is provided with two memory arrays M-ARY0 and M-ARY1. The memory array M-ARY0 is, as shown in FIG. 4A, composed of $n+1$ pairs of complementary data lines $D0 \cdot \overline{D0}$ to $Dn \cdot \overline{Dn}$ which are disposed so as to extend horizontally as viewed in FIG. 4A, $(m+1)/2$ even-number row address word lines W0, W2, to Wm-3, Wm-1 which are disposed vertically, and $(n+1) \times (m+1)/2$ memory cells MC which are respectively disposed at the intersections between the complementary data lines and the word lines in such a manner that the memory cells MC are arranged in a matrix. In the memory array M-ARY0, the input/output nodes of the $(m+1)2$ memory cells MC which are arranged in the same column are mutually connected to the corresponding one of the pairs of complementary data lines $D0 \cdot \overline{D0}$ to $Dn \cdot \overline{Dn}$. The select control terminals of $n+1$ memory cells MC which are arranged in the same row are mutually connected to the corresponding one of the word lines W0, W2, to Wm-3, Wm-1.

Similarly, the memory array M-ARY1 is, as shown in FIG. 4B, composed of $n+1$ pairs of complementary data lines $D0 \cdot \overline{D0}$ to $Dn \cdot \overline{Dn}$ which are disposed so as to extend horizontally as viewed in FIG. 4B, $(m+1)/2$ odd-number row address word lines W1, W3 to Wm-2, Wm which are disposed vertically, and $(n+1) \times (m+1)/2$ memory cells MC which are respectively disposed at the intersections between the complementary data lines and the word lines in such a manner that the memory cells MC are arranged in a matrix. In the memory array M-ARY1, the input/output nodes of $(m+1)/2$ memory cells MC are arranged in the same column are mutually connected to the corresponding one of the pairs of complementary data lines $D0 \cdot \overline{D0}$ to $Dn \cdot \overline{Dn}$. The select control terminals of $n+1$ memory cells MC which are arranged in the same row are mutually connected to the corresponding one of the word lines W1, W3 to Wm-2, Wm.

The word lines W0, W2 to Wm-3, Wm-1 in the memory array M-ARY0 are respectively connected to the corresponding word line select signal lines X0, X2 to Xm-3, Xm-1 in the X-address decoder DCRX0 through the the corresponding switching MOSFETs Q1, Q2 to Q3, Q4 which are included in the X-switching circuit XS0. Switching MOSFETs Q5 and Q6 which are connected in series are provided between the word line select signal line X0 and the word line W2. Similarly, two series connected switching MOSFETs, such as MOSFETs Q7, Q8 and Q9, Q10, are provided between each of the other word line select signal lines X2, Xm-3 and one of the word lines Wm-3, Wm-1 which is subsequent and adjacent thereto. Among these switching MOSFETs, the MOSFETs Q5, Q7 to Q9 are mutually supplied at their gates with a non-inverted internal address signal ax0 for the least significant bit, while the above-described MOSFETs Q1, Q2 to Q3, Q4 are mutually supplied at their gates with the inverted signal $\overline{ax0}$ formed by inverting the least significant bit internal address signal ax0. Further, the MOSFETs Q6, Q8 to Q10 are mutually supplied at their gates with the above-described timing signal $\phi z$.

The word lines W1, W3 to Wm-2, Wm in the memory array M-ARY1 are respectively connected to the corresponding word line select signal lines X0, X2 to Xm-3, Xm-1 in the X-address decoder DCRX1 through the corresponding switching MOSFETs Q11, Q12 to Q13, Q14 which are included in the X-switching circuit XS1. Switching MOSFETs Q15 and Q16 which are connected in series are provided for the MOSFET Q11 in parallel form. Similarly, series-connected switching MOSFETs, such a MOSFETs Q17, Q18 to Q19, Q20, and Q21, Q22, are provided for the other MOSFETs Q12 to Q13 and Q14 in a parallel form. Among these switching MOSFETs, the MOSFETs Q11, Q12 to Q13, Q14 are mutually supplied at their gates with a non-inverted internal address signal ax0 for the least significant bit, while the MOSFETs Q15, Q17 to Q19, Q21 are mutually supplied at their gates with the inverted signal $\overline{ax0}$ formed by inverting the least significant bit internal address signal axo. Further, the MOSFETs Q16, Q18 to Q20, Q22 are mutually supplied with the above-described timing signal $\phi z$.

The X-address decoders DCRX0 and DCRX1 decode the complementary internal address signals ax1 to axi except for the address signal for the least significant bit to selectively raise the word line select signals X0, X2 to Xm-3, Xm-1 to the high level, as described above. In other words, these word line select signals include no condition of the least significant bit address signal. Accordingly, the word line select signals X0, X2 to Xm-3, Xm-1 which are formed by the X-address decoder DCRX1 are simultaneously raised to the high level together with the word line select signals X0, X2 to Xm-3, Xm-1 formed by the X-address decoder DCRX1 at all times.

When the static type RAM is set in either the write operation mode or the normal read operation mode the timing signal $\phi z$ is shifted to the low level, the MOSFETs Q6, Q8 to Q10 in the X-switching circuit XS0 and the MOSFETs Q16, Q18 to Q20, Q22 in the X-switching circuit XS1 are turned off. In addition, the MOSFETs Q1 to Q4 in the X-switching circuit XS0 or the MOSFETs Q11 to Q14 in the X-switching circuit XS1 are selectively turned on in accordance with the complementary internal address signal ax0 for the least significant bit. Thus, in either the memory array M-ARY0 or M-ARY1, one word line which corresponds to the one of the word line select signals X0, X2 to Xm-3, Xm-1, which are selectively raised to the high level is brought into a select state which is defined by a high level.

When the static type RAM is set in the zooming read mode and the timing signal $\phi z$ is raised to the high level, the MOSFETs Q6, Q8 to Q10 in the X-switching circuits XS0 and the MOSFETs Q16, Q18 to Q20, Q22 in the X-switching circuits XS1 are simultaneously turned on. Further, the MOSFETs Q1 to Q4 or the MOSFETs Q5, Q7 to Q9 in the X-switching circuits XS0 and the MOSFETs Q11 to Q14 or the MOSFETs Q15, Q17 to Q19, Q21 in the X-switching circuit XS1 are selectively turned on in accordance with the complementary internal address signal ax0 for the least significant bit. Thus, in either the memory array M-ARY0 or M-ARY1, one word line which corresponds to the word line select signals X0, X2 to Xm-3, Xm-1 which are selectively raised to the high level is brought into a select state which is defined by a high level. In the other memory array, one word line which is adjacent to the selected word line and to which a subsequent row address is assigned is simultaneously brought into a select state which is defined by a high level. At this time, in the memory array M-ARY0 the word line select signals X0, X2 to Xm-3, Xm-1 are substantially shifted by one by the operation of the X-switching circuit XS0.

More specifically, when the static type RAM is set in either the normal write operation mode or the normal read operation mode and the timing signal $\phi z$ is shifted to the low level, one word line which is specified by the externally supplied address signals is brought into a select state. When the static type RAM is set in the zooming read mode and the timing signal $\phi z$ is raised to the high level, one word line which is specified by the externally supplied address signals and one word line which is assigned a subsequent row address are simultaneously brought into a select state.

Among the complementary data lines constituting the memory array M-ARY0, those which are given even-number addresses are coupled to the corresponding switching MOSFETs Q23 . Q24, Q27 . Q28 to Q31 . Q32 in the column switch CSW0, as respresentatively shown by the complementary data lines D0 . $\overline{D0}$, D2 . $\overline{D2}$ and Dn−1 . $\overline{Dn-1}$ in FIG. 4A. The other sides of each of these pairs of switching MOSFETs are coupled to complementary common data lines CD0 . $\overline{CD0}$ which are a non-inverted signal line and an inverted signal line, respectively. Similarly, among the complementary data lines constituting the memory array M-ARY0, those which are given odd-number addresses are coupled to the corresponding switching MOSFETs Q25 . Q26, Q29 . Q30 to Q33 . Q34 in the column switch CSW0, as representatively shown by the complementary data lines D1 . $\overline{D1}$, D3 . $\overline{D3}$ and Dn . $\overline{Dn}$ in FIG. 4A. The other sides of each of these pairs of switching MOSFETs are coupled to complementary common data lines CD1 . $\overline{CD1}$ which are a non-inverted signal line and an inverted signal line, respectively. Among the complementary data lines constituting the memory array M-ARY1, those which are given even-number addresses are coupled to the corresponding switching MOSFETs Q35 . Q36, Q39 . Q40, to Q43 . Q44 in the column switch CSW1, as representatively shown by the complementary data lines D0 . $\overline{D0}$, D2 . $\overline{D2}$ and Dn−1 . $\overline{Dn-1}$ in FIG. 4B. The other sides of each of these pairs of switching MOSFETs are coupled to complementary common data lines CD2 . $\overline{CD2}$ which are a non-inverted signal line and an inverted signal line, respectively. Similarly, among the complementary data lines constituting the memory array M-ARY1, those which are given odd-number addresses are coupled to the corresponding switching MOSFETs Q37 . Q38, Q41 . Q42 to Q45 . Q46 in the column switch CSW1, as representatively shown by the complementary data lines D1 . $\overline{D1}$, D3 . $\overline{D3}$ and Dn . $\overline{Dn}$ in FIG. 4B. The other sides of each of these pairs of switching MOSFETs are coupled to complementary common data lines CD3 . $\overline{CD3}$ which are a non-inverted signal line and an inverted signal line, respectively.

The gates of the switching MOSFETs Q23 . Q24 to Q33 . Q34 in the column switch CSW0 are mutually connected to each other and are further connected to the corresponding data line select signal lines Y0 to Yn−1, respectively, in the Y-address decoder DCRY0 through switching MOSFETs Q47 to Q49 or Q50 to Q52 in the Y-switching circuit YS0. Similarly, the gates of switching MOSFETs Q35 Q36 to Q45 Q46 in the column switch CSW1 are mutually connected to each other and are further connected to the corresponding data line select signal lines Y0 to Yn−1, respectively, in the Y-address decoder DCRY1 through switching MOSFETS Q65 to Q67 or Q68 to Q70 in the Y-switching circuit YS1. As described above, the Y-address decoders DCRY0 and DCRY1 are mutually supplied with the internal complementary address signals ay1 to ayj except for the the least significant bit address signal. The data line select signals Y0 to Yn−1 which are formed in the Y-address decoder DCRY0 are simultaneously raised to the high level in correspondence with the data line select signals Y0 to Yn−1, respectively, which are formed in the Y-address decoder DCRY1.

The column switch CSW0, the Y-switching circuit YS0 and the Y-address decoder DCRY0 perform in combination a data line select operation similar to the above-described word line select operation with respect to the corresponding memory array M-ARY0. More specifically, when the static type RAM is set in either the normal write operation mode or the normal read operation mode and the timing signal $\phi z$ is shifted to the low level, the switching MOSFETs Q53, Q55 to Q57 in the Y-switching circuit YS0 are turned off. The switching MOSFETs Q47 to Q49 or the MOSFETS Q50 to Q52 in the Y-switching circuit YS0 are selectively turned on in accordance with the complementary internal addres signal ay0 for the least significant bit. Thus, the data line select signal Y0 to Yn−1 which are selectively raised to the high level are selectively supplied to the corresponding switching MOSFETs Q23 . Q24, Q27 . Q28 to Q31 . Q32 or Q25 . Q26, Q29 . Q30 to Q33 . Q34 in the column switch CSW0, and one pair of complementary data lines which are selectively connected to the complementary common data lines CD0 . $\overline{CD0}$ or CD1 . $\overline{CD1}$.

When the static type RAM is set in the zooming read mode and the timing signal $\phi z$ is raised to the high level, the switching MOSFETs Q53, Q55 to Q57 in the Y-switching circuit YS0 are simultaneously turned on. Further, the switching MOSFETs Q47 to Q49 and the MOSFETs Q54, Q56 and Q58 or the MOSFETs Q50 to Q52 in the Y-switching circuit YS0 are selectively turned on in accordance with the least significant bit complementary internal address signal ay0. Thus, in a manner similar to that in the case of the above-described X-switching circuit, one pair of complementary data lines which are specified by the Y-address signals AY0 to AYj are selected and, at the same time, another pair of complementary data lines which are adjacent to the selected complementary data lines and to which a subsequent column address is assigned are brought into a select state.

The above-described complementary data line select operation is similarly affected by the memory array M-ARY1, together with the column switch CSW1, Y-switching circuit circuit YS1 and Y-address decoder DCRY1 which are provided in correspondence with the memory array M-ARY1.

More specifically, in a manner similar to that in the case of the word line select operation, when the static type RAM is set in either the normal write operation mode or the normal read operation mode and the timing signal $\phi z$ is shifted to the low level, in each of the memory arrays M-ARY0 and M-ARY1 one pair of complementary data lines which are specified by the externally supplied Y-address signals AY0 to AYj are selectively brought into a select state. When the static type RAM is in the zooming read mode and the timing signal $\phi z$ is raised to the high level, in each memory array one pair of complementary data lines which are specified by the externally supplied Y-address signals AY0 to AYj and another pair of complementary lines which are adjacent to said complementary data lines and to which is assigned a subsequent column address are simultaneously brought into a select state.

As a result of the above-described word and complementary data line select operations, when the static type RAM is set in the zooming read mode, two memory cells in each of the memory arrays M-ARY0 and M-ARY1, i.e., a total of four memory cells, are simultaneously brought into a select state. These memory cells are further connected to the input/output circuit I/O through the corresponding complementary common data lines CD0 . $\overline{CD0}$ to CD3 . $\overline{CD3}$.

Figure 5:
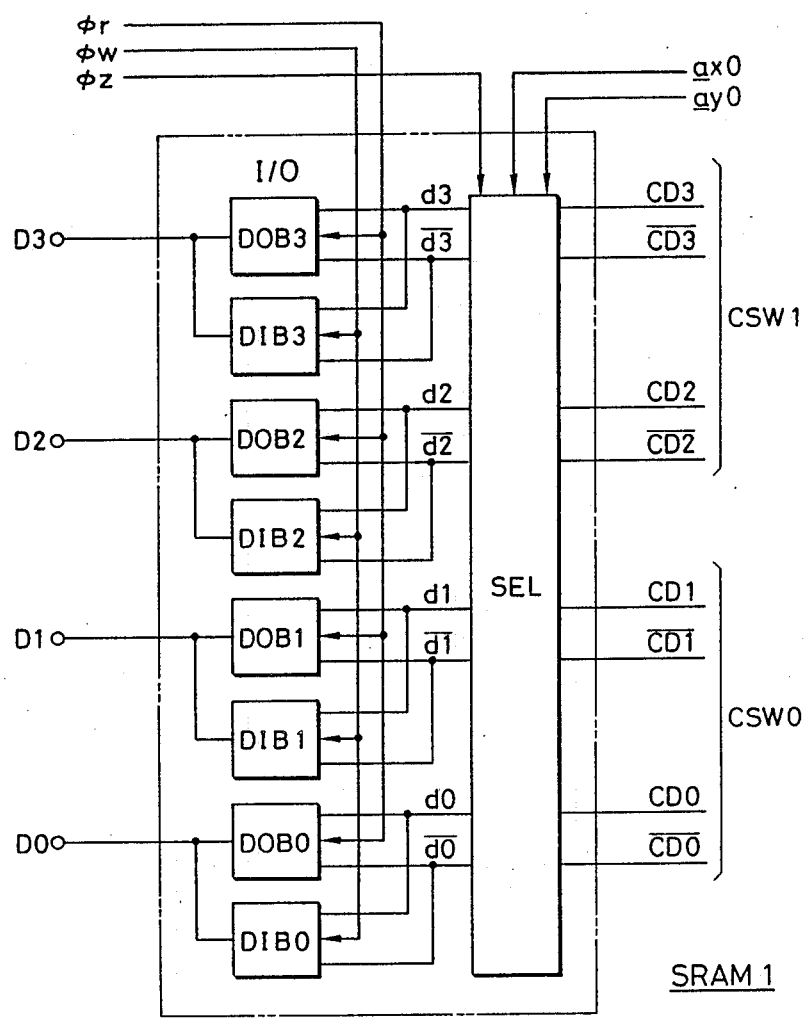
FIG. 5 is a circuit block diagram showing one example of the input/output circuit in the static type RAM shown in FIG. 3.

Referring to FIG. 5, the input/output circuit I/O includes data input buffers DIB0 to DIB3 and data output buffers DOB0 to DOB3, which are provided in correspondence with the data input/output terminals D0 to D3, and an input/output select circuit SEL.

The complementary common data lines CD0 . $\overline{CD0}$ to CD3 . $\overline{CD3}$ which are coupled to select memory cells in the memory arrays M-ARY0 and M-ARY1 through the column switches CSW0 and CSW1 are coupled to input terminals, respectively, which are provided on one side of the input/output select circuit SEL. Complementary signal lines d0 . $\overline{d0}$ to d3 . $\overline{d3}$ are coupled to input terminals, respectively, which are provided on the other side of the input/output select circuit SEL. These complementary signal lines d0 . $\overline{d0}$ to d3 . $\overline{d3}$ are coupled to output terminals of the corresponding data input buffers DIB0 to DIB3 and also coupled to input terminals of the corresponding data output buffers DOB0 to DOB3. The input terminals of the data input buffers DIB0 to DIB3 are mutually coupled to the corresponding data input/output terminals D0 to D3, respectively.

The input/output select circuit SEL is supplied with the least significant bit complementary internal address signal ax0 and ay0 from the address buffer ADB and is also supplied with the timing signal $\phi z$ from the timing control circuit TC. The data input buffers DIB0 to DIB3 are mutually supplied with the timing signal $\phi w$ from the timing control circuit TC. The data output buffers DOB0 to DOB3 are mutually supplied with the timing signal $\phi r$ from the timing control circuit TC. As described above, the timing signals $\phi w$ and $\phi r$ are raised to the high level when the static type RAM is set in the write operation mode and the read operation mode, respectively.

The input/output select circuit SEL in the input/output circuit I/O connects together the complementary common data lines CD0 . $\overline{CD0}$ to CD3 . $\overline{CD3}$ and the complementary signal lines d0 . $\overline{d0}$ to d3 . $\overline{d3}$. That is, the data input/output terminals D0 to D3, are selected in a predetermined combination in accordance with the least significant bit complementary internal address signals ax0 and ay0 and the timing signal $\phi z$. More specifically, when the static type RAM is set in either the normal write operation mode or the normal read operation mode and the timing signal $\phi z$ is shifted to the low level, one memory cell which is specified by the X-address signals AX0 to Axi and the Y-address signals AY0 to AYj is connected to the data input/output terminal D0 at all times as shown in Table 1 below.

TABLE 1

| $\phi z$ | ax0 | ay0 | D0 | | | |
|---|---|---|---|---|---|---|
| 0 | 0 | 0 | CD0 | — | — | — |
| 0 | 0 | 1 | — | CD1 | — | — |
| 0 | 1 | 0 | — | — | CD2 | — |
| 0 | 1 | 1 | — | — | — | CD3 |

On the other hand, when the static type RAM is set in the zooming read mode and the timing signal $\phi z$ is raised to the high level, data read from a memory cell which is specified by the X-address signal AX0 to AXi and the Y-address signals AY0 to AYj is delivered from the data input/output terminal D0 at all times as shown in Table 2 below. Pieces of read data output from the other three memory cells which are simultaneously selected are respectively delivered from the data input/output terminals D1 to D3 in a predetermined combination as shown in Table 2.

TABLE 2

| $\phi z$ | ax0 | ay0 | D0 | D1 | D2 | D3 |
|---|---|---|---|---|---|---|
| 1 | 0 | 0 | CD0 | CD1 | CD2 | CD3 |
| 1 | 0 | 1 | CD1 | CD0 | CD3 | CD2 |
| 1 | 1 | 0 | CD2 | CD3 | CD0 | CD1 |
| 1 | 1 | 1 | CD3 | CD2 | CD1 | CD0 |

The data input buffer DIB0 in the input/output circuit I/O is selectively activated when the timing signal $\phi w$ is raised to the high level. In this activated state, the data input buffer DIB0 forms complementary write signals from write data which is supplied through the data input/output terminal D0 and supplies the write signals to a selected memory cell from the input/output select circuit SEL through one of the pairs of complementary common data lines CD0 . $\overline{CD0}$ to CD3 . $\overline{CD3}$. Although not necessarily limited, when the static type RAM is set in a predetermined simultaneous write operation mode, the data input buffers DIB0 to DIB3 are simultaneously activated to form complementary write signals from pieces of write data which are supplied through the corresponding data input/output terminals D0 to D3. Additionally, these write signals are supplied from the input/output select circuit SEL through the corresponding complementary common data lines CD0 . $\overline{CD0}$ to CD3 . $\overline{CD3}$ so that the pieces of write data are respectively written into four memory cells which are selected simultaneously. Although not necessarily limited, when the timing signal $\phi w$ is at the low level, the output terminals of the data input buffers DIB0 to DIB3 are held in an high impedance state.

The data output buffers DOB0 to DOB3 in the input/output circuit I/O are selectively activated when the timing signal $\phi r$ is raised to a high level. In this activated state, the data output buffers DOB0 to DOB3 amplify read signals which are transmitted from selected memory cells through the complementary common data lines CD0 . $\overline{CD0}$ to CD3 . $\overline{CD3}$, respectively, to the input/output select circuits SEL which delivers the corresponding data to the input/output terminals D0 to D3. Although not necessarily limited, when the timing singal or is at the low level, the output terminals of the data output buffers DOB0 to DOB3 are held in a high-impedance state.

Figure 6A:
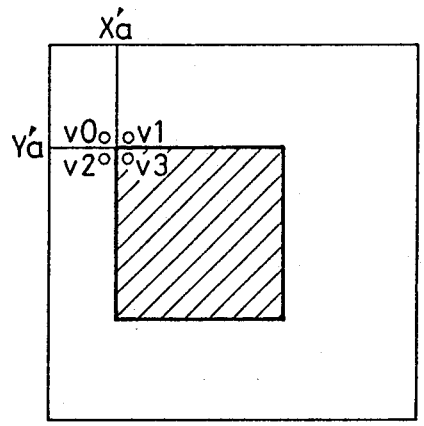
FIGS. 6a and 6b show one example of an arithmetic process for reducing a displayed image which is executed in the image processing system shown in FIG. 1; and, FIGS. 7a and 7b show one example of an arithmetic process for enlarging a displayed image which is executed in the image processing system shown in FIG. 1.
Figure 6B:
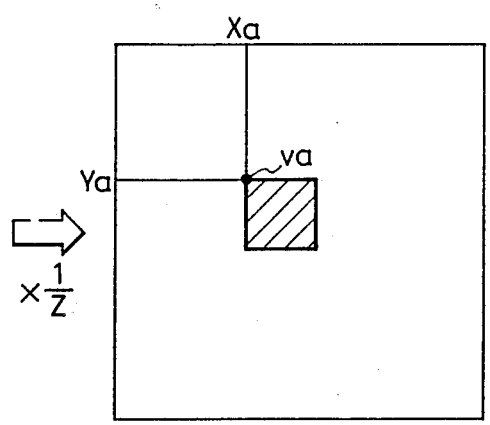
Figure 7A:
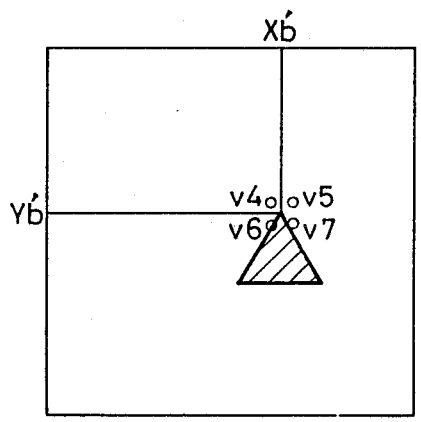
Figure 7B:
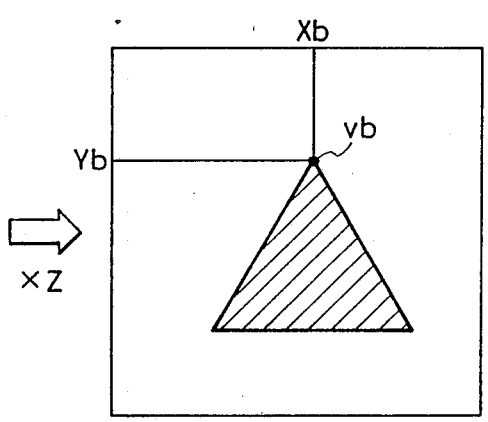

As has been described above, the static type RAM in accordance with this embodiment is provided with a memory array M-ARY0 corresponding to the word lines having even number row addresses and a memory array M-ARY1 corresponding to word lines having odd number row addresses. Further, these memory arrays are respectively provided with X-address decoders, DCRX0 and DCRX1, Y-address decoders, DCRY0 and DCRY1 and column switches CSW0 and CSW1. X-switching circuits XS0 and XS1 are provided between the X-address decoder DCRX0 and the memory array M-ARY0 and between the X-address decoder DCRX1 and the memory array M-ARY1, respectively. Y-switching circuits YS0 and YS1 are provided between the Y-address decoder DCRY0 and the column switch CSW0 and between the Y-address decoder DCRY1 and the column switch CSW1, respectively. When the static type RAM is set in either the normal write operation mode or the normal read operation mode, one memory cell which is specified by the X-address signals AX0 to AXi and the Y-address signals AY0 to AYj is selectively brought into a select state. When the static type RAM is set in the zooming read mode, two memory cells in each memory array, i.e., a total of four memory cells, are simultaneously selected and are respectively connected to the corresponding complementary common data lines CD0 . $\overline{CD0}$ to CD3 . $\overline{CD3}$. Read signals output from these memory cells are delivered in a predetermined combination from the data input/output terminals D0 to D3 of the input/output terminal I/O. Accordingly, it is possible with the image processing system in accordance with this emobodiment to realize in one memory access cycle an operation of reading nearby 4-bit storage data which is required for reduction and enlargement of a displayed image such as those shown in FIGS. 6a and 7a/7b. Thus, the speed of a zooming process executed by the image processing system is increased, and the load on the bit map processor in image processing is reduced, so that the processing capability of the system is improved.

As will be appreciated from the foregoing description of the embodiment, when the present invention is applied to a semiconductor memory such as a static type RAM which is employed as an arithmetic memory in an image processing system, the following advantages are obtained:

(1) An operation for reading nearby 4-bit storage data which is required for a zooming process of a displayed image can be realized in one memory access cycle by providing a semiconductor memory such as a static type RAM with a function which enables storage of data to be simultaneously read out from a total of four memory cells, that is, one memory cell which is disposed at the intersection between a data line and a word line which are specified by externally supplied address signals and three memory cells which are respectively disposed at the intersection between said data and word lines and a data line and a word line which are adjacent to said data and word lines and which are given subsequent addresses, respectively.

(2) The advantage mentioned in (1) enables an increase in the speed of the zooming process of a displayed image.

(3) The advantage mentioned in (1) enables a reduction in the load on the bit map processor in image processing and permits improvement in the processing capability of the image processing system.

Although the invention accomplished by the present inventor has been practically described above by way of one embodiment, the present invention is not necessarily limited to the described embodiment and various changes and modifications may, of course, be imparted thereto without departing from the gist of the invention. For example, although in the static type RAM in accordance with this embodiment a data line and a word line which are specified by externally supplied address signals and a data line and a word line which are adjacent to these data and word lines and which are given subsequent addresses, respectively, are simultaneously selected, the arrangement may be such that specified data and word lines and a data line and a word line which are adjacent thereto and whose addresses immediately precede those of said data and word lines are simultaneously selected. The internal address signal for selecting a memory array or a column switch is not necessarily limited to the address signal ax0 or ay0 for the least significant bits, but internal address signals for other bits, e.g., the most significant bit, may also be employed. Further, although in this embodiment the zooming read mode is selectively set in accordance with the zooming read mode signal ZR which is externally supplied as a control signal, the arrangement may be such that reading of nearby 4-bit memory cells is effected at all times even in the normal read operation mode. The X- and Y-switching circuits shown in FIGS. 4A and 4B may be simplified by selectively forming the word line select signals X0, X2 to Xm−3, Xm−1 and Y0 to Yn−1 in the X-address decoders DCRX0 and DCRX1 and the Y-address decoders DCRY0 and DCRY1 in accordance with the timing signal $\phi z$. Although in the described embodiment the circuits for driving the word lines are provided in the X-address decoders DCRX0 and DCRX1, respectively, these driver circuits may be provided on the output sides of the X-switching circuits XS0 and XS1, respectively. The input/output select circuit SEL which is provided in the input/output select circuit I/O in the described embodiment may, for example, be mutually provided for the memory control units MCU. The static type RAM may be so designed that the RAM which is in the form of a single unit is able to input and output data consisting of a number of bits which is required for an arithmetic memory VAM. Further, the present invention may be carried out in various forms in terms of the block configuration of the image processing system shown in FIG. 1, the block configuration of the arithmetic memory shown in FIG. 2, the block configuration of the static type RAM shown in FIG. 3, and the combination of various control signals and address signals.

Although the invention accomplished by the present inventor has mainly been described through one example in which the invention is applied to a static type RAM employed as an arithmetic memory in an image processing system which is an applicable field of the invention on which it is based, the present invention is not necessarily limited thereto. The invention may be applied to various types of semiconductor memory such as dynamic type RAM and ROM (Read-Only Memory) which are employed for a similar use. The present invention may be widely applied to semiconductor memories which are employed as arithmetic memories in large processing systems that have at least a displayed image zooming function.

What is claimed is:

1. A semiconductor memory comprising:
   a plurality of word lines;
   a plurality of data lines;
   a plurality of memory cells, each memory cell disposed adjacent to each intersection between said plurality of word lines and said plurality of data lines;
   first decode means coupled to said plurality of word lines for selecting a group of word lines of said plurality of word lines on the basis of first address signals;
   first switch means coupled between said plurality of word lines and said first decode means for setting one or more word lines in said group of word lines to a selected voltage level in accordance with first complementary address signals ($\overline{ax0}$, $ax0$) and a control signal ($\phi z$); and
   wherein said first switch means includes,
   a first switching field effect transistor (Q1) coupled between a first word line (W0) of said plurality of word lines and a word line select signal line to be supplied an output signal (X0) of said first decode means,
   a second switching field effect transistor (Q11) coupled between a second word line (W1) of said plurality of word lines and said word line select signal line,
   third and fourth switching field effect transistors (Q15, Q16) coupled in series with each other and coupled in parallel with said second switching field effect transistor (Q11), and
   fifth and sixth switching field effect transistors (Q5, Q6) coupled in series between a third word line (W2) in said group of word lines and said word line select signal line.

2. The semiconductor memory of claim 1 further comprising:
   means coupled to said first switch means for controlling said first and third switching field effect transistors in accordance with at least one of said first complementary address signals;
   means for controlling said second and fifth switching field effect transistors in accordance with another of said first complementary address signals; and
   means for controlling said fourth and sixth switching field effect transistor in accordance with said control signal.

3. The semiconductor memory of claim 2 further comprising:
   column switch means coupled between said plurality of data lines and common data lines;
   second decode means, coupled to said column switch means, for selecting a group of data lines of said plurality of data lines in accordance with second address signals;
   second switch means, coupled between said column switch means and said second decode means for transferring memory cell information from one or more data lines in said plurality of data lines to one or more common data lines of said common data lines through said second switch means on the basis of second complementary address signals ($\overline{axo}$, $axo$) and said control signal ($\phi z$),
   wherein said second switch means includes,
   a seventh switching field effect transistor (Q47) coupled between a first data line (D0) of said plurality of data lines and a data line select signal line to be supplied an output signal (Y0) of said second decode means,
   an eighth switching field effect transistor (Q50) coupled between a second data line (D1) of said plurality of data lines and said data line select signal line,
   ninth and tenth switching field effect transistors (Q53, Q54) coupled in series with to each other and coupled in parallel with said eighth switching field effect transistor (Q50), and
   eleventh and twelfth switching field effect transistors (Q59, Q60) coupled in series between a third data line (D2) of said plurality of data lines and the data line select signal line.

4. A semiconductor memory according to claim 3, further comprising a second controller coupled to said second switch, the second controller including, means for controlling said seventh and ninth switching field effect transistors in accordance with one of said second complmentary address signals, means for controlling said eighth and eleventh switching field effect transistor on the basis of another of said second complementary address signals, and means for controlling said tenth and twelfth switching field effect transistors, on the basis of said control signal.

5. A semiconductor memory comprising:

first and second memory arrays each of which include, a plurality of word lines, a plurality of data lines, and a plurality of memory cells, each of which is disposed adjacent to an intersection between said word lines and said data lines;

first decode means coupled to said plurality of word lines for selecting a group of word lines in accordance with first address signals;

first switch means, coupled between said first memory array and said first decode means, for selectively making a word line belonging to said first memory array a selected voltage level in accordance with first complementary address signals and a control signal;

second switch means coupled between said second memory array and said first decode means, for making a word line belonging to said second memory array a selected voltage level in accordance with said first complementary address signals and said control signal; and wherein said first switch means includes, a first switching field effect transistor coupled between a first word line of said plurality of word lines and a word line select signal line to be supplied an output signal of said first decode means, second and third switching field effect transistors coupled in series between a second word line of said plurality of word lines and said first output means, said second switch means including a fourth switching field effect transistor coupled between a third word line of said plurality of word lines and said word line select signal line, and fifth and sixth switching field effect transistors coupled in series with each other and coupled in parallel with said fourth switching field effect transistor.

6. The semiconductor memory according to claim 5, further comprising a controller coupled to said first and second switch means, the controller including, means for controlling said first and fifth switching field effect transistors in accordance with at least one of said first complementary address signals, means for controlling said second and fourth switching field effect transistors in accordance with at least one of said first complementary address signals, and means for controlling said third and sixth switching field effect transistors in accordance with said control signal.

* * * * *

UNITED STATES PATENT AND TRADEMARK OFFICE
CERTIFICATE OF CORRECTION

PATENT NO. : 4,965,770

DATED : October 23, 1990

INVENTOR(S) : Kasumasa Yanagisawa

It is certified that error appears in the above-identified patent and that said Letters Patent is hereby corrected as shown below:

Claim 1, column 18, line 2, delete "(axo, axo)"
                        line 3, delete "($\emptyset$z)"
                        line 5, delete "(Q1)"
                        line 6, delete "(WO)"
                        line 8, delete "(XO)"
                        line 10, delete "(Q11)"
                        line 11, delete "(W1)"
                        line 15, delete "(Q15, Q16)"
                        line 17, delete "(Q11)"
                        lines 18-19, delete "(Q5, Q6)"
                        line 20, delete "(W2)"

Claim 3, column 18, lines 48-49, delete "(axo, axo)"
                        line 49, delete "($\emptyset$z)"
                        line 51, delete "(Q47)"
                        line 52, delete "(DO)"
                        line 54, delete "(YO)"
                        line 56, delete "(Q50)"
                        line 57, delete "(D1)"
                        line 61, delete "(Q53, Q54)"
                        line 63, delete "(Q50)"
                        line 65, delete "(Q59, Q60)"
                        line 66, delete "(D2)"

UNITED STATES PATENT AND TRADEMARK OFFICE
CERTIFICATE OF CORRECTION

PATENT NO. : 4,965,770

DATED : October 23, 1990

INVENTOR(S) : Kasumasa Yanagisawa

It is certified that error appears in the above-identified patent and that said Letters Patent is hereby corrected as shown below:

Claim 5, column 20, lines 10-11, delete "first output means" and insert therefor --word line select signal line--.

Signed and Sealed this

Fourteenth Day of January, 1992

Attest:

HARRY F. MANBECK, JR.

*Attesting Officer*      *Commissioner of Patents and Trademarks*